(12) United States Patent
Zha et al.

(10) Patent No.: US 6,891,437 B2
(45) Date of Patent: May 10, 2005

(54) CURRENT AMPLIFIER STRUCTURE

(75) Inventors: Gang Zha, Guangdong (CN); Solomon Ng, Hong Lok Yuan Tui Po (HK)

(73) Assignee: Shenzhen STS Microelectronics Co., Ltd. (CN)

( * ) Notice: Subject to any disclaimer, the term of this patent is extended or adjusted under 35 U.S.C. 154(b) by 0 days.

(21) Appl. No.: 10/071,013

(22) Filed: Feb. 8, 2002

(65) Prior Publication Data

US 2002/0167344 A1 Nov. 14, 2002

(30) Foreign Application Priority Data

Feb. 10, 2001 (CN) ......................................... 01104518 A

(51) Int. Cl.⁷ ............................................... H03F 3/45
(52) U.S. Cl. ..................................... 330/257; 330/260
(58) Field of Search ................................ 330/252, 257, 330/260, 292

(56) References Cited

U.S. PATENT DOCUMENTS 6,150,884 A * 11/2000 Fattaruso ................ 330/292 X

* cited by examiner

Primary Examiner—Steven J. Mottola
(74) Attorney, Agent, or Firm—Lisa K. Jorgenson; Michelle Leveque

(57) ABSTRACT

A circuit structure for performing current amplification. The circuit structure may be standardized as a current amplifier cell such that many types of applications requiring current amplification may be created. The basic amplifier cell, which may accept voltage or current sources as an input signal, produces two identical output signals which may be used for feedback or serve as input to additional amplifier stages. This simple structure may be extended to perform current amplification with variable gain or AC or DC voltage-to-current conversion through the use of appropriately selected resistive elements.

9 Claims, 4 Drawing Sheets

Prior Art - Current Amplifier

Prior Art - Voltage to Current Converter

CURRENT AMPLIFIER STRUCTURE

PRIORITY

Foreign Priority under Title 35, U.S. Code, Section 119, is claimed to Chinese Application 01104518.3, filed Feb. 10, 2001, within 12 months prior to the filing date of the instant application

BACKGROUND OF THE INVENTION

1. Technical Field

The present invention relates generally to analog integrated circuits and more specifically to current amplification including voltage-to-current conversion and current amplification.

2. Discussion of the Prior Art

While there are many standard circuits available for voltage amplification, current amplification circuits are uncommon. In a typical current amplifier, amplification is achieved through the use of a current mirror with different emitter areas for each transistor and different emitter resistors. At large values of gain, precise matching of emitter areas and resistance becomes critical.

Referring to FIG. 1, the classical manner of amplifying the current is shown. The current amplifier of FIG. 1 includes current source I1, transistors Q1, Q2, and resistive elements R1, R2. The transistors labeled Q1 and Q2 have differing emitter areas of 1 unit and 2 units, respectively. In all other aspects transistors Q1 and Q2 are identical. Because of the difference in emitter areas, the saturation current out of Q2 will be twice that of Q1; $IS2=2*IS1$.

The voltage between the base and ground is given by:

$$Vb = I1*R1 + VT*ln(I1/Is1) \quad (1)$$

Vb may also be found as:

$$Vb = I2*R2 + VT*ln(I2/Is2) \quad (2)$$

Equating (1) and (2), we have:

$$I1*R1 + VT*ln(I1/Is1) = I2*R2 + VT*ln(I2/Is2) \quad (3)$$

with $R1=2*R2$, and $Is2=2*Is1$

Equation (3) has the solution $I2=2*I1$, and so the output current is twice the input current. This output gain is determined by the choice of resistive elements R1 and R2, in conjunction with the difference in emitter areas.

This circuit has several drawbacks. For large values of current gain, the resistive elements R1 and R2 and the emitter elements of transistors Q1 and Q2 must be matched very accurately, as can be seen by inspection of equation (3). A further drawback of this circuit is that the values of gain that may be produced are limited to the relative values of the resistors and the emitter areas. This gain value is restricted to integer values.

A circuit with a simple structure, accepting either a current source or voltage source as an input, and producing identical current outputs could be used to address the shortcomings of the current amplifier prior art. Also, it would be advantageous if such a circuit could be used as a standard current amplifier cell in a variety of applications in which current amplification or voltage-to-current conversion is needed.

SUMMARY OF THE INVENTION

It is an object of the invention to provide a current amplifier circuit structure having a simple structure, thereby making it suitable for use as a standardized current amplifier circuit cell.

It is further an object of the invention that such a current amplifier circuit structure be able to accept either an input current source or an input voltage source.

It is yet another object of the invention that the current amplifier circuit structure be easily adaptable to a variety of applications, such as those applications requiring current amplification with precisely controllable gain characteristics and those applications calling for voltage-to-current conversion.

Therefore, according to the structure of the present invention, a simple integrated circuit is used to amplify the input signal. The integrated circuit consists of an amplifier cell, which may be used as a building block in many circuit configurations, including a variable gain current amplifier, and a AC or DC voltage-to-current converter. The basic amplifier cell consists of several functional elements, including an input stage, a current mirror stage, and an output stage. The input stage and current mirror stage allow the input signal to be duplicated while isolating the input signal. This duplicated signal is used as input to the output stage. The output stage uses a current mirror to produce two identical output currents, one suitable for feedback or other purposes, at corresponding output terminals. These output currents may then be used to produce current amplification or voltage-to-current conversion through the judicious use of one or more resistive elements coupled to these output terminals.

Current amplification is enabled through the use of resistive elements that determine the output gain of the amplifier. The gain may be real-valued and may be accurately determined by appropriate selection of the resistive elements. In an exemplary embodiment, a first resistive element is placed in a feedback connection between the first output current and the negative input terminal. A second resistive element is coupled between the first output terminal and ground. The value of these resistive elements determines the amount of current amplification at the output of the final stage.

AC or DC voltage-to-current conversion may also be performed using the simple current amplification cell by using a voltage differential pair as input to the cell. The output current is determined using a resistive element. In an exemplary embodiment of the present invention, voltage-to-current conversion is enabled by presenting a voltage signal between the two terminals of the input stage. This input voltage signal produces an identical voltage at the input to the output stage through the action of the current mirror. Through the action of the current mirror in the output stage, the identical output currents are present at the two output terminals. By placing a resistive element at the node between the first output terminal and ground, the output current from the second terminal is found to be proportional to the input voltage. The resistive element determines the value of the output current.

This circuit is able to source or sink current, and thus is capable of providing AC or DC voltage-to-current conversion.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 2:
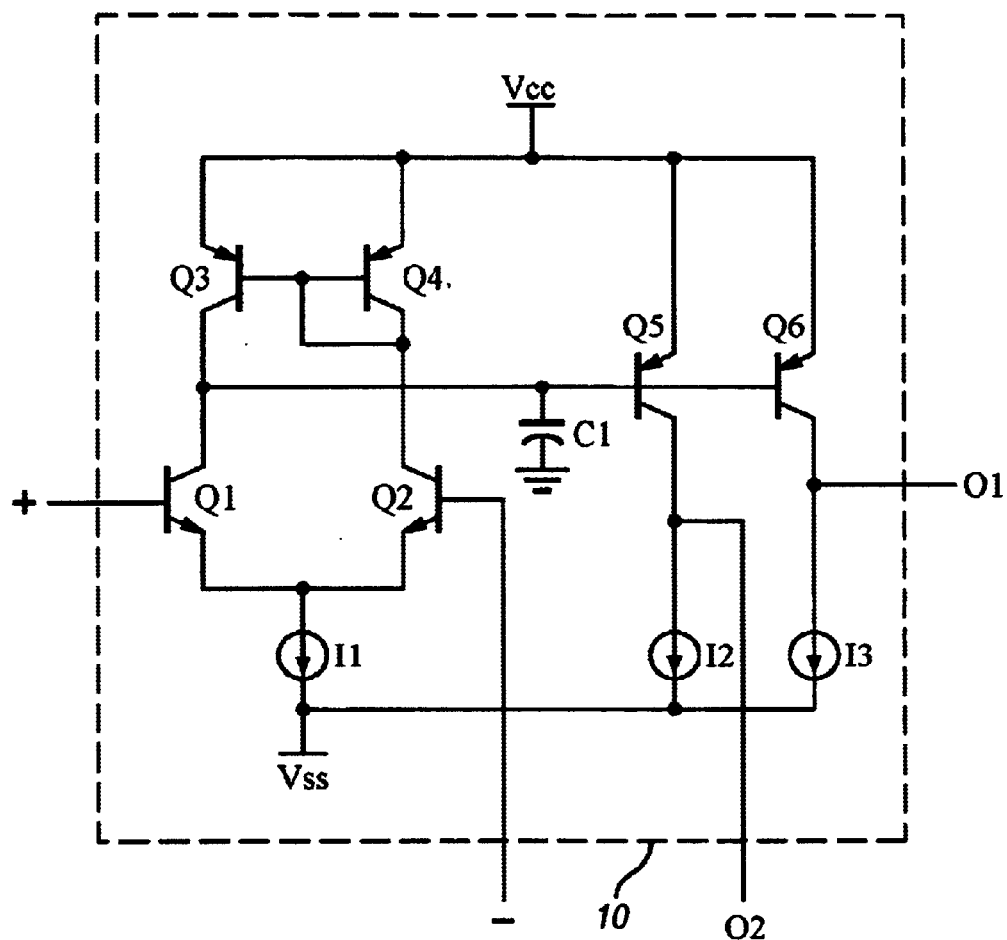
FIG. 2 shows the circuit structure of a current amplifier cell, according to the present invention.

The current amplification cell of the present invention produces identical output currents when a one-terminal or two-terminal input signal is applied thereto. Referring now to FIG. 2, the current amplifier cell 10 for creating identical output currents in accordance with the present invention is shown. Current amplifier cell 10 contains the following elements: n-p-n/p-n-p transistors Q1, Q2, Q3, Q4, Q5, and Q6, capacitive element C1, and current sources I1, I2, and I3. A constant current I1 is coupled to both emitters of transistors Q1 and Q2. The other terminal of current I1 is coupled to a constant supply voltage Vss. Transistors Q1 and Q2 are coupled as a differential pair input stage as shown. The base of transistor Q1 is coupled to the positive input terminal, while the base of transistor Q2 is coupled to the negative input terminal. The collector of Q1 is coupled to the collector of Q3 in the Q3–Q4 current mirror. The collector of Q2 is coupled to the collected to the collector of Q4 in the Q3–Q4 current mirror. The base of the Q3 transistor is coupled to the base of the Q4 transistor, and the base of Q4 transistor is also coupled to the Q4 collector. The Q3 emitter is coupled to the Q4 emitter as shown. The emitter of transistor Q4 is coupled to the emitters of transistors Q5 and Q6 in the output stage. The collector of transistor Q3 is coupled to the base of transistor Q5 and also to the base of transistor Q6. Further, the collector of transistor Q3 is coupled to capacitive element C1. Capacitive element C1 is terminated in ground. The output of the current source I2 is coupled to the collector of transistor Q5. The output of the current source I3 is coupled to the collector of transistor Q6. Both current source I2 and current source I3 are terminated in the constant supply voltage Vss. A first output O1 is taken from the connection between current source I2 and the collector of transistor Q5. A second output O2 is taken from the connection between current source I3 and the collector of transistor Q6.

The current amplifier cell 10 produces identical output currents at output terminals O1 and O2. The theory of operation of current amplifier cell 10 will now be described. A signal is applied between the positive and negative input terminals of the cell. Through the action of the differential pair Q1–Q2 and the Q3–Q4 current mirror, identical output currents will be present at the collectors of Q3 and Q4. The Q3–Q4 current mirror serves to isolate variations in the input signal and produce a stable signal to the output stage. The output stage also contains a current mirror; in this case, the Q5–Q6 current mirror. The emitters of transistors Q5 and Q6 are coupled to the constant supply voltage Vcc, and the bases of transistors Q5 and Q6 receive the same input current. Therefore, through the use of identical current sources I2 and I3, the outputs O1 and O2 both receive the same current. Either O1 or O2 may be used for feedback, which can improve the accuracy of the output signal.

Figure 3:
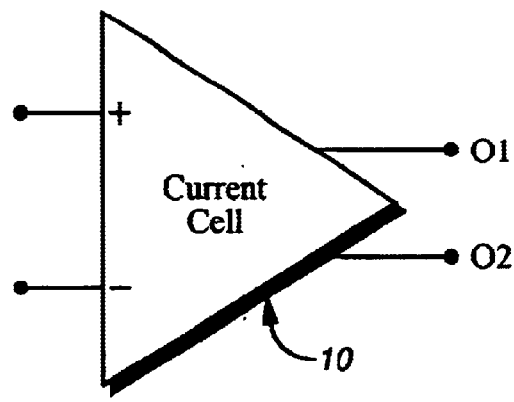
FIG. 3 shows a current amplification cell with two input terminals and two output terminals, according to the present invention.

Referring now to FIG. 3, the input and output terminals for a current amplifier cell 10 are shown. As described above, the input signal is applied between the positive terminal and the negative terminal. The identical output currents are available at terminals O1 and O2. In this configuration, the current amplifier cell 10 may be used as a building block in many applications.

Figure 4:
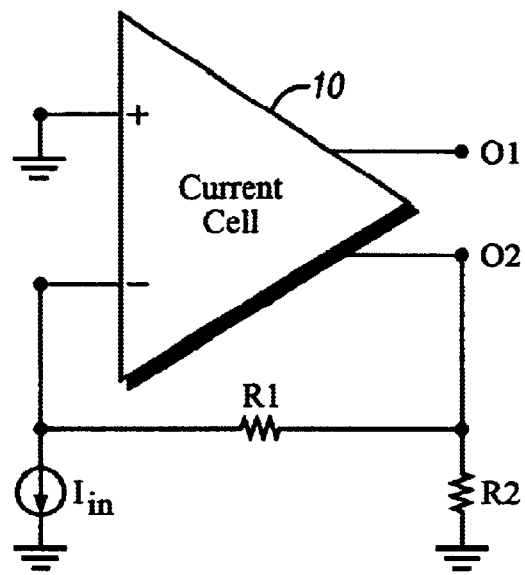
FIG. 4 shows a block diagram of an application containing the current amplification cell that performs variable gain current amplification, according to the present invention.

Referring now to FIG. 4, an application using the current amplifier cell 10 is shown. The application performs current amplification. The positive input terminal is coupled to ground. The negative input terminal is coupled to an input source I_in, which is terminated in ground. The second output terminal O2 is coupled through resistive element R1 to the negative input terminal in a feedback connection. The second output terminal O2 is also coupled to ground through resistive element R2. Through the action of the current amplifier cell 10 and the feedback connection, the output current is given by $$IO1 = I\_in * (1.0 + R1/R2)$$

This simple feedback circuit is able to produce arbitrary values of current gain with good accuracy.

Figure 5:
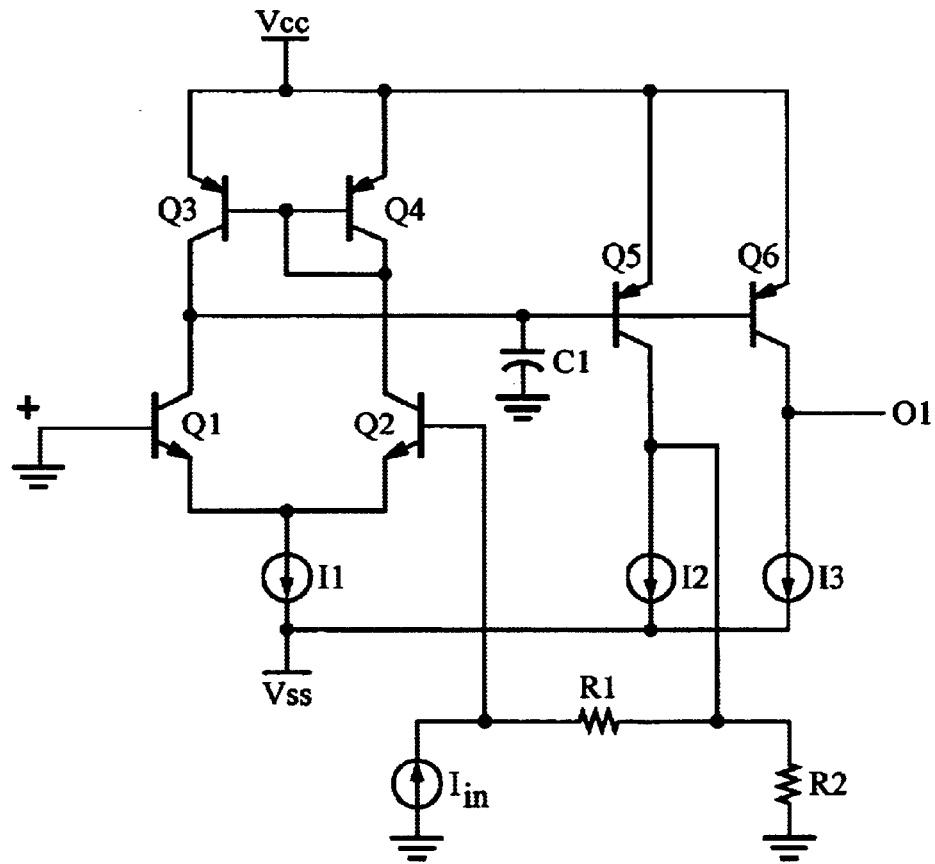
FIG. 5 shows the circuit structure of an application that performs current amplification, according to the present invention.

Referring now to FIG. 5, a circuit that performs current amplification in accordance with an embodiment of the present invention is shown. The circuit comprises n-p-n/p-n-p transistors Q1, Q2, Q3, Q4, Q5, and Q6, capacitive element C1, current sources I1, I2, and I3, input current source I_in, and resistive elements R1 and R2. A constant current I1 is coupled to both emitters of transistors Q1 and Q2. The other terminal of the current I1 is coupled to a constant supply voltage Vss. Transistors Q1 and Q2 are coupled as a differential pair input as shown. The base of transistor Q1 is coupled to the positive input terminal, which terminates in ground. The base of transistor Q2 is coupled to the negative input terminal, which is coupled to an input current source, I_in. The input current source, I_in, is terminated in ground. The collector of Q1 is coupled to the collector of Q3 in the Q3–Q4 current mirror. The collector of Q2 is coupled to the collected to the collector of Q4 in the Q3–Q4 current mirror. The base of the Q3 transistor is coupled to the base of the Q4 transistor, and the base of Q4 transistor is also coupled to the Q4 collector. The Q3 emitter is coupled to the Q4 emitter as shown. The emitter of transistor Q4 is coupled to the emitters of transistors Q5 and Q6 in the output stage. The collector of transistor Q3 is coupled to the base of transistor Q5 and also to the base of transistor Q6. Further, the collector of transistor Q3 is coupled to capacitive element C1.

Capacitive element C1 is terminated in ground. The output of the current source I2 is coupled to the collector of transistor Q5. The output of the current source I3 is coupled to the collector of transistor Q6. Both current source I2 and current source I3 are terminated in the constant supply voltage Vss. Both resistive elements, R1 and R2, are coupled to the collector of transistor Q5. Resistive element R2 is coupled to ground, while resistive element R1 is attached in a feedback connection to the base of transistor Q2.

This current amplification system operates correctly because the current out of the collector of transistor Q5 is the same as the current out of the collector of transistor Q5. The input current, I_in, is coupled to the base of transistor Q2. Since both resistive elements R1 and R2 are coupled to ground, the voltage potential must be the same across R1 and R2. Since the base of transistor Q1 is grounded, the input current I_in flows entirely through the resistive element R1. And so, I_R1=I_in. Therefore, I_in*R1=I_R2*R2, so that I_R2=I_in*R1/R2. The output current is: I_O1=I_R1+I_R2=I_in*(1+R1/R2).

It is noted that in addition to resistors R1, R2, resistive elements may include transistors, operational amplifiers, etc., or other elements or combination of elements that provide the desired resistive characteristics.

This output current result was obtained because O1 and O2 are equal. This is due to the action of the output stage. Through the action of the differential pair Q1–Q2, identical output currents will be present at the collectors of Q3 and Q4. The Q3–Q4 current mirror serves to isolate variations in the input signal and produce a stable signal to the output stage. The output stage also contains a current mirror; in this case, the Q5–Q6 current mirror. The emitters of transistors Q5 and Q6 are coupled to the constant supply voltage Vcc, and the bases of transistors Q5 and Q6 receive the same input voltage. Therefore, through the use of identical current sources I2 and I3, the outputs O1 and O2 both receive the same current.

Figure 6:
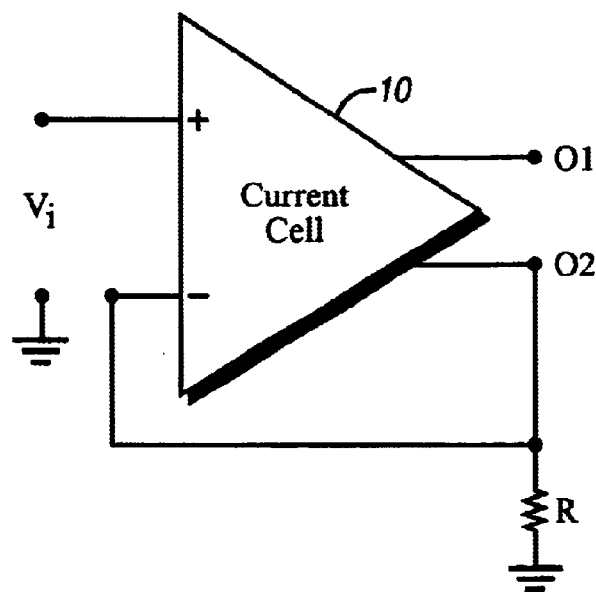
FIG. 6 shows a block diagram of an application containing the current amplification cell that performs voltage-to-current conversion, according to the present invention.

Referring now to FIG. 6, a voltage-to-current conversion application using the current amplifier cell 10 is shown. A voltage Vi is coupled to the positive input terminal of current amplifier cell 10 as shown. The output O2 of current amplifier cell 10 is coupled to a resistive element R and also coupled to the negative input terminal of the current amplifier cell 10. The other terminal of resistive element R is coupled to ground. Due to the action of the current amplifier cell 10, the output current through O1 is Vi/R. Thus, the output current magnitude is controlled by the input potential voltage Vi and resistive element R.

Figure 1:
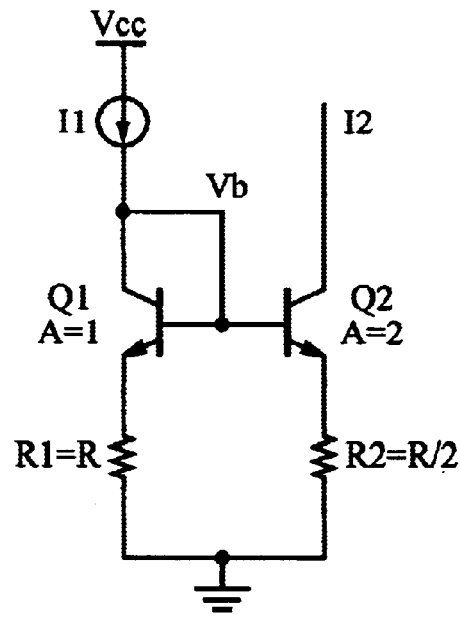
FIG. 1 is an example of current amplification, according to the prior art.
Figure 1A:
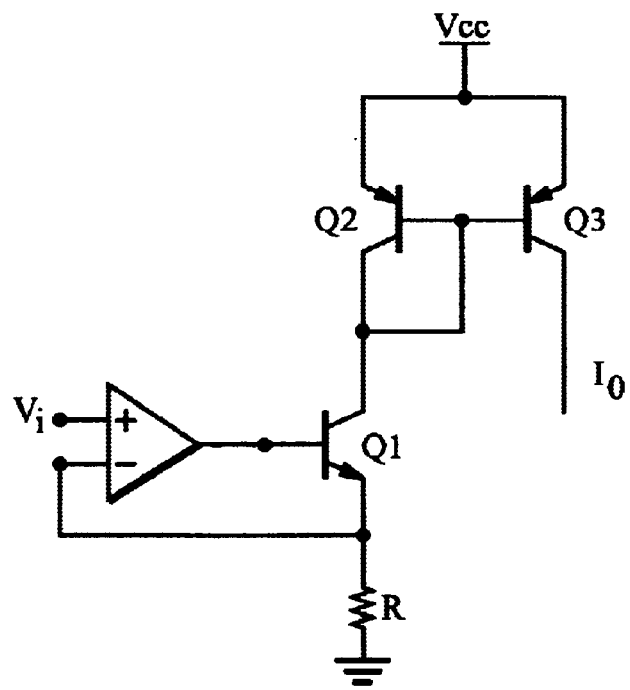
FIG. 1A is an example of voltage-to-current conversion, according to the prior art.

In a typical voltage-to-current converter, conversion is achieved through the use of a current mirror and a feedback circuit. Referring now to FIG. 1A, the classical technique for performing voltage-to-current conversion is shown. The voltage-to-current converter of FIG. 1A includes an input voltage Vi, operational amplifier OA, transistors Q1, Q2 and Q3, and a resistive element R1. The voltage, Vi, is coupled to the positive input terminal of the operational amplifier, while the operational amplifier output is coupled to the control terminal of transistor Q1. The first terminal of transistor Q1 is coupled to the negative input terminal of the operational amplifier OA and the resistive element R1. The other terminal of resistive element R1 is coupled to ground. The second terminal of transistor Q1 is attached to the first terminal of transistor Q2. The output current is taken from the first terminal of transistor Q3, while the second terminal of transistors Q2 and Q3 are coupled to a constant supply voltage Vcc. The control terminals of transistors Q2 and Q3 are coupled, and the control terminal of transistor Q2 is also coupled to the first terminal of transistor Q2.

The current through R1 is IR1=Vi/R1.

This current is equal to I0 due to the action of the Q2–Q3 current mirror. So, Io=IR1=Vi/R1. This arrangement only works for a DC input signal. If the input is AC, then this circuit will be unable to sink current.

Figure 7:
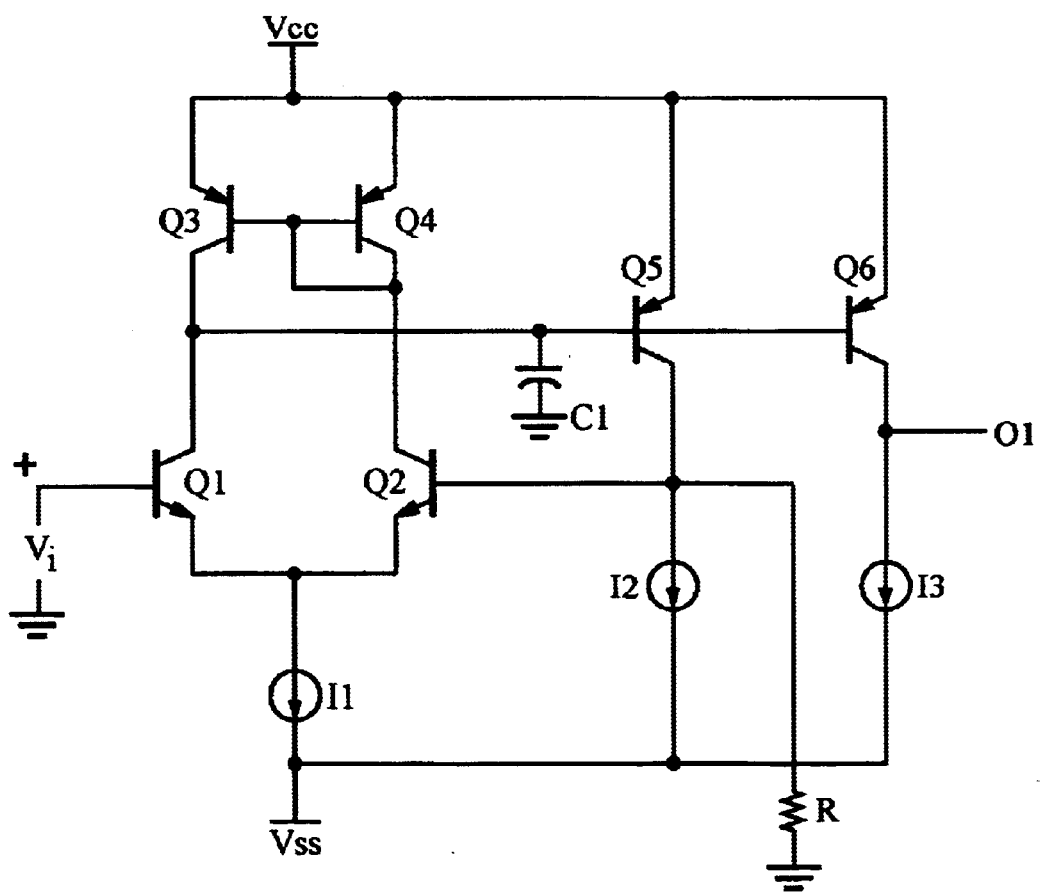
FIG. 7 shows the circuit structure of an application that performs voltage-to-current conversion, according to the present invention.

Referring to FIG. 7, a circuit that performs AC or DC voltage-to-current conversion, in accordance with the present invention is shown. The circuit comprises n-p-n/p-n-p transistors Q1, Q2, Q3, Q4, Q5, and Q6, capacitive element C1, and current sources I1, I2, and I3. A constant current I1 is coupled to both emitters of transistors Q1 and Q2. The other terminal of the current I1 is coupled to a constant supply voltage Vss. Transistors Q1 and Q2 are coupled as a differential pair input as shown. The base of transistor Q1 is coupled to an input voltage Vi, which is terminated in ground. The base of transistor Q2 is coupled to resistive element R, which is coupled to ground. The base of transistor Q2 is also coupled to the collector of transistor Q5 and the output of current source I2. The collector of Q1 is coupled to the collector of Q3 in the Q3–Q4 current mirror. The collector of Q2 is coupled to the collector of Q4 in the Q3–Q4 current mirror. The base of the Q3 transistor is coupled to the base of the Q4 transistor, and the base of Q4 transistor is also coupled to the Q4 collector. The Q3 emitter is coupled to the Q4 emitter as shown. The emitter of transistor Q4 is coupled to the emitters of transistors Q5 and Q6 in the output stage. The collector of transistor Q3 is coupled to the base of transistor Q5 and also to the base of transistor Q6. Further, the collector of transistor Q3 is coupled to capacitive element C1. Capacitive element C1 is terminated in ground. The output of the current source I2 is coupled to the collector of transistor Q5. The output of the current source I3 is coupled to the collector of transistor Q6. Both current source I2 and current source I3 are terminated in the constant supply voltage Vss.

This circuit produces an output current that is proportional to the input voltage. The constant of proportionality is the value of the resistive element R. The feedback connection between the collector of transistor Q5 and the negative input of the differential pair Q1–Q2 causes the voltage potential at the base of transistor Q2 to be the same as the input voltage potential Vi. Thus, the current through resistive element R is Vi/R. The current out of the collector of transistor Q5 is the same as the current out of the collector of transistor Q6. And so, the output current I_O1 is given by Vi/R. It is noted that in addition to resistor R, resistive element R may include transistors, operational amplifiers, etc., or other elements or combination of elements that provide the desired resistive characteristic.

While the invention has been particularly shown and described with reference to a preferred embodiment, it will be understood by those skilled in the art that various changes in form and detail may be made therein without departing from the spirit and scope of the invention. For example, one of ordinary skill in the art will recognize that p-n-p transistors may be substituted for the n-p-n transistor configurations described above, with minor circuit modification, without departing from the spirit and scope of the invention.

What is claimed is:

1. A circuit, comprising:
a current amplifier cell, further comprising:
an input stage suitable for accepting an input signal, wherein the input stage further comprises:
a first transistor having a control terminal and a first and second terminals;
a second transistor having a control terminal and first and second terminals; and
a current source having a first terminal and a second terminal;
wherein the first and second transistors are coupled at their control terminals to receive the input signal, the first terminals of the first and second transistors are coupled to the first terminal of the current source, the second terminal of the current source is coupled to a first voltage potential, and the second terminals of the first and second transistors are coupled to the gain stage;

an output stage that generates a first output signal and a second output signal, wherein the second output signal can be used as a feedback signal to the input stage in an application into which the current amplifier cell may be placed, wherein the first and second output signals have the same current wherein the output stage further comprises:

a plurality of circuit elements coupled to the gain stage, said plurality of circuit elements comprising:

a fifth transistor having a control terminal, a first terminal, and a second terminal;

a sixth transistor having a control terminal, a first terminal, and a second terminal; and a capacitive element;

wherein the control terminal of the fifth transistor is coupled to the second terminal of the first transistor and to the first terminal of the capacitive element, the second terminal of capacitive element is coupled to a first voltage potential, and the second terminal of the fifth transistor is coupled to the second terminal of the sixth transistor, the second terminal of both the fifth transistor and the sixth transistor are coupled to the second terminal of the third transistor and the second terminal of the fourth transistor, the control terminal of the fifth transistor is coupled to the control terminal of the sixth transistor, the first terminal of the fifth transistor is coupled to the first terminal of a second current source, the second terminal of the second current source is coupled to a constant voltage potenial, the first terminal of the sixth transistor is coupled to the first terminal of a third current source, the second terminal of the third current source is coupled to the first voltage potential, the first output signal originates between the first terminal of the fifth transistor and the first terminal of the second current souce, and the second output signal originates between the first terminal of the sixth transistor and the first terminal of the third current source; and a gain stage intermediate and coupled to the input and output stages that isolates the input stage, said gain stage configured in a current mirror configuration and having equivalent current through the current mirror configuration, wherein the gain stage further comprises:

a current mirror coupled to the input stage, said current mirror comprising:

a third transistor having a control terminal, a first terminal, and a second terminal; and a fourth transistor having a control terminal, a first terminal, and a second terminal;

wherein the second terminal of the first transistor is coupled to the first terminal of the third transistor and to the output stage of the current amplifier cell, the second terminal of the second transistor is coupled to the first terminal of the fourth transistor, the control terminal of the third transistor is coupled to the control terminal of the fourth transistor and the first terminal of the fourth transistor, and the second terminals of the third and fourth transistors are coupled to a constant voltage source and to the output stage of the current amplifier cell.

2. A circuit comprising:

a current amplifier cell, further comprising:

an input stage suitable for accepting an input signal;

an output stage that generates a first output signal and a second output signal, wherein the second output signal can be used as a feedback signal to the input stage in an application into which the current amplifier cell may be placed, wherein the first and second output signals have the same current, wherein the output stage further comprises:

a plurality of circuit elements coupled to the gain stage, said plurality of circuit elements comprising:

a first transistor having a control terminal, a first terminal, and a second terminal;

a second transistor having a control terminal, a first terminal, and a second terminal; and a capacitive element;

wherein the control terminal of the first transistor is coupled to the input stage and to the first terminal of the capacitive element, the second terminal of capacitive element is coupled to a first voltage potential, and the second terminal of the first transistor is coupled to the second terminal of the second transistor, the second terminal of both the first transistor and the second transistor are coupled to the gain stage, the control terminal of the first transistor is coupled to the control terminal of the second transistor, the first terminal of the first transistor is coupled to the first terminal of a first current source, the second terminal of the first current source is coupled to a constant voltage potential, the first terminal of the second transistor is coupled to the first terminal of a second current source, the second terminal of the first current source is coupled to the first voltage potential, the first output signal originates between the first terminal of the first transistor and the first terminal of the first current souce, and the second output signal originates between the first terminal of the second transistor and the first terminal of the second current source; and a gain stage intermediate and coupled to the input and output stages that isolates the input stage, said gain stage configured in a current mirror configuration and having equivalent current through the current mirror configuration.

3. The current amplifier cell of claim 2, wherein the input signal provided to the input stage is obtained by coupling a first input terminal of the input stage to the first voltage potential and coupling a second input terminal of the input stage to a current source and wherein a gain of the first output signal is determined in accordance with a resistive element coupled to the second output signal.

4. The current amplifier cell of claim 3, wherein the first input terminal of the input stage is the control terminal of the first transistor and the second input terminal of the input stage is the control terminal of the second transistor, and wherein the resistive element comprises:

a first resistor coupled to the control terminal of the second transistor, the current source, and the output stage; and a second resistor coupled between the second output signal and the first voltage potential.

5. The current amplifier cell of claim 4, wherein the gain of the second output signal is a real value.

6. A current amplifier, comprising:

a current amplifier cell, comprising:

an input stage suitable for accepting an input signal;

an output stage that generates a first output signal and a second output signal, wherein the second output signal is operable as a feedback signal in an application into which the current amplifier cell may be placed; and a gain stage intermediate and coupled to the input and output stages that isolates the input stage, said gain stage configured in a current mirror configuration and having equivalent current through the current mirror configuration so as to cause the first and second output signals to have the same current;

a current source coupled to a negative terminal of the current amplifier cell;

a first resistive element coupled between the second output signal of the current amplifier cell, and the negative terminal of the current amplifier cell; and a second resistive element coupled between the second output signal of the current amplifier cell, and a voltage potential.

7. The current amplifier cell of claim 2, wherein the input signal provided to the input stage is obtained by applying a first voltage potential between a first input terminal of the input stage and a second voltage potential, and coupling a second input terminal of the input stage to a first output of the output stage, and controlling the gain of a second output by connecting the first output of the output stage to a resistive element which is coupled to a third voltage potential.

8. The current amplifier cell of claim 7, wherein the first input terminal of the input stage is the control terminal of the first transistor and the second input terminal of the input stage is the control terminal of the second transistor, and wherein the resistive element comprises:

a resistor coupled to the control terminal of the second transistor, the current source, and the first terminal of the fifth transistor of the output stage.

9. A voltage-to-current converter, comprising:

a current amplifier cell, comprising:
an input stage suitable for accepting an input signal;
an output stage that generates a first output signal and a second output signal, wherein the second output signal is operable as a feedback signal to the input stage in an application into which the current amplifier cell may be placed and wherein the first and second output signals have the same current;
a gain stage intermediate and coupled to the input and output stages that isolates the input stage, said gain stage configured in a current mirror configuration and having equivalent current through the current mirror configuration;
a voltage potential applied betweem positive and negative terminals of the current amplifier cell, wherein the first output signal is coupled to the negative terminal; and
a resistive element coupled between the first output and a voltage potential.

* * * * *